(12) United States Patent
Nishida et al.

(10) Patent No.: US 6,557,148 B1
(45) Date of Patent: Apr. 29, 2003

(54) CIRCUIT ANALYSIS TOOL AND RECORDING MEDIUM HAVING RECORDED PROGRAM FOR MAKING THE CIRCUIT ANALYSIS TOOL FUNCTION

(75) Inventors: Kouji Nishida, Tokyo (JP); Yasuji Araki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 168 days.

(21) Appl. No.: 09/713,337

(22) Filed: Nov. 16, 2000

(30) Foreign Application Priority Data

Jan. 18, 2000 (JP) ........................................ 2000-008936

(51) Int. Cl.[7] .............................................. G06F 17/50
(52) U.S. Cl. .................................... 716/4; 716/5; 716/6
(58) Field of Search ...................... 716/4–6; 703/14–16

(56) References Cited

U.S. PATENT DOCUMENTS 6,374,205 B1 * 4/2002 Kuribayashi et al. ......... 703/14

FOREIGN PATENT DOCUMENTS

JP 5-312905 11/1993

* cited by examiner

*Primary Examiner*—Matthew Smith
*Assistant Examiner*—Brandon Bowers
(74) *Attorney, Agent, or Firm*—McDermott, Will & Emery

(57) ABSTRACT

Provided is a circuit analysis tool having a function that enables the use of a high-accuracy simulator of SPICE2 or the like while reducing the time required for processing from the first simulation. The circuit analysis tool of the present invention distinguishes between a circuit element in which voltage and current values or a signal value change or changes in response to the input of a test signal and a circuit element in which no change of the values or value occurs on the basis of connection information of a semiconductor integrated circuit. The circuit element in which no change of the values or value occurs in response to the input of the test signal is replaced by an equivalent constant voltage terminal or grounding terminal, reducing the number of circuit elements to be subjected to simulation to be continuously executed (the amount of data of circuit information).

9 Claims, 7 Drawing Sheets

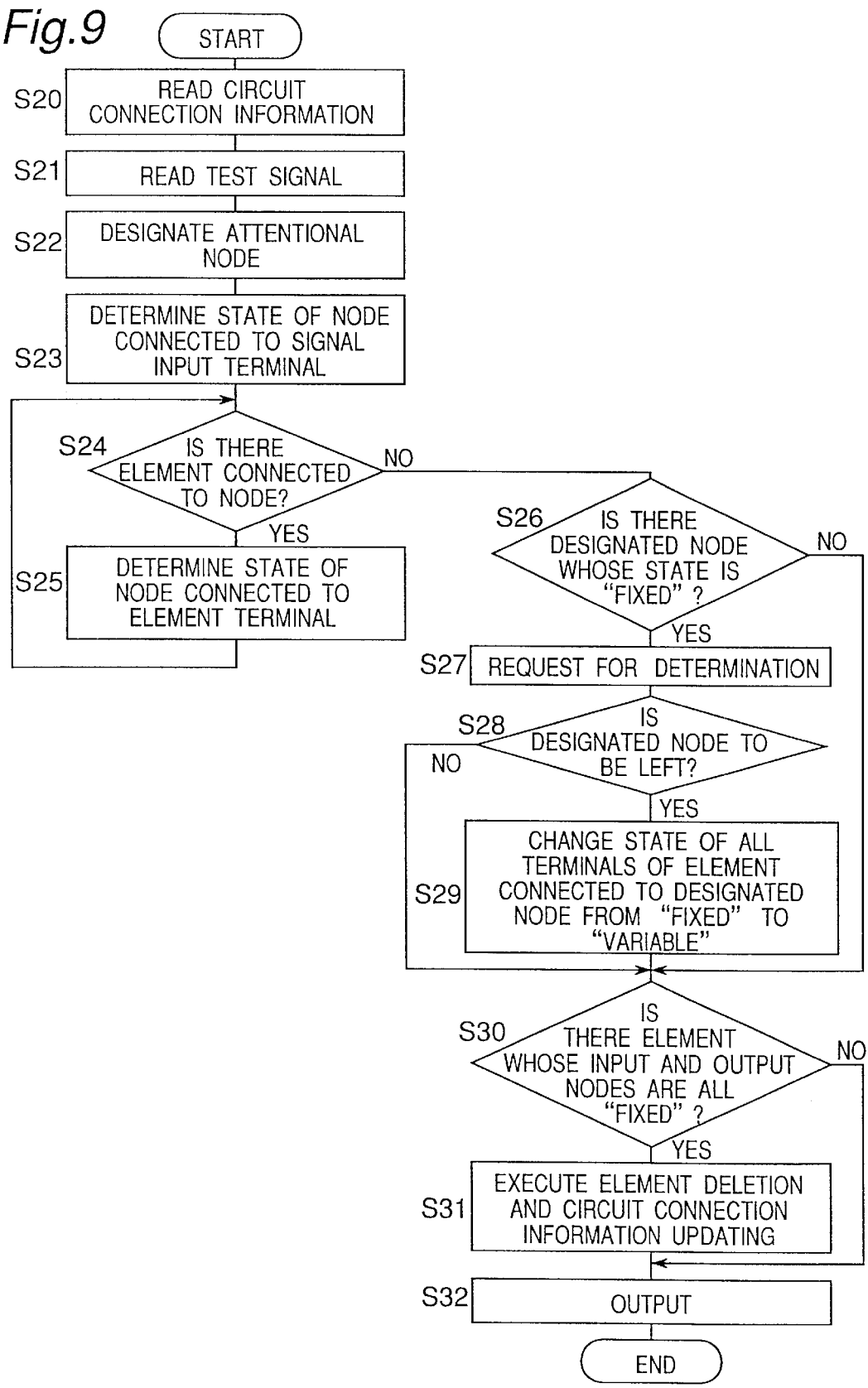

CIRCUIT ANALYSIS TOOL AND RECORDING MEDIUM HAVING RECORDED PROGRAM FOR MAKING THE CIRCUIT ANALYSIS TOOL FUNCTION

BACKGROUND OF THE INVENTION

The present invention relates to a circuit analysis tool for use in developing an LSI (large scale integrated circuit).

A circuit simulator, a logical simulator and the like are known as circuit analysis tools to be used during the design phase of a semiconductor integrated circuit. The circuit simulator measures the voltages and currents of internal circuit elements for the solution of the circuit equation specified on the basis of circuit connection information described at the transistor level. As the circuit simulator, SPICE2 developed by University of California, Berkeley (UCB) is popularized.

On the other hand, the logical simulator examines the signal levels of "1" and "0" at nodes inside the circuit on the basis of the circuit connection information described at the logical level.

In accordance with an increase in scale of the semiconductor integrated circuit to be designed, an increasing time required for the simulation has become a problem. It can be considered to reduce the processing time as a solution to the above problem by means of a simple simulation device such as a timing simulator instead of a circuit simulator of the aforementioned SPICE2 or the like. However, the simple simulation device such as the above-mentioned timing simulator has low accuracy and sometimes fails in obtaining a satisfactory result.

As another method for reducing the time required for the simulation, it can be considered that the designer himself or herself manually specifies the circuit to be subjected to processing among all the circuits. However, the work of manually extracting a specific circuit element from a large scale semiconductor integrated circuit is a very complicated work and not practicable.

In order to reduce the time necessary for the simulation, there is proposed a simulation device that omits overlapped calculating operations, for example, by excluding a circuit element that has not been changed from the time of execution of the preceding simulation after circuit correction from the objects to be processed, consequently reducing the time required for the second and subsequent simulating operations (Japanese Patent Laid-Open Publication No. HEI 5-312905). However, according to the aforementioned simulation device, the time required for the first simulation cannot be reduced since the first simulation necessarily includes all the circuits as the objects to be processed.

SUMMARY OF THE INVENTION

The present invention has the object of providing a circuit analysis tool having a function that enables the use of a high-accuracy simulator of SPICE2 or the like singly or together with a simulation function while reducing the time required for processing from the first simulation.

The present invention provides a first circuit analysis tool comprising: a storage section of circuit connection information of a semiconductor integrated circuit; a node state determining section that, when a specified signal is inputted to signal input terminals or internal nodes of the circuit specified by a circuit connection information stored in the storage section, determines at every node connected to terminals of circuit elements constituting the circuit whether or not potential of the node changes in accordance with a lapse of time; and an element deleting section that updates the circuit connection information so as to delete a circuit element provided with only a terminal connected to a node whose potential does not change in accordance with a lapse of time from the circuit specified by the circuit connection information stored in the storage section on the basis of a result of determination in the node state determining section and instead provide each node whose potential does not change with a terminal and attaches information for specifying the potential of the node that does not change in accordance with a lapse of time to each terminal provided.

The present invention provides a second circuit analysis tool, based on the first circuit analysis tool, further comprising: a designating means for designating an attentional node among the nodes inside the circuit specified by the circuit connection information stored in the storage unit; and a designated node protecting means for changing determination results of all the nodes connected to the terminals of the circuit element connected to the designated node to a node whose potential changes in accordance with a lapse of time when a circuit element connected to the node designated by the designating means exists among the circuit elements that have only terminals connected to the node whose potential is determined to be unchanged in accordance with a lapse of time in the node state determining section, wherein the element deleting section executes an element deleting process on the basis of a result of determination obtained after the processing in the designated node protecting means.

The present invention provides a third circuit analysis tool, based on the first or second circuit analysis tool, further comprising an output unit for displaying the circuit specified by the circuit connection information updated by the element deleting section.

The present invention provides a fourth circuit analysis tool, based on the third circuit analysis tool, wherein the output unit displays the result of determination in the node state determining section with regard to each node of the circuit to be displayed.

The present invention provides a fifth circuit analysis tool, based on the third or fourth circuit analysis tool, wherein the output unit further displays the circuit specified by the circuit connection information obtained before the updating executed by the element deleting section in a state in which the circuit can be discriminated from the circuit specified by the circuit connection information obtained after updating.

The present invention provides a sixth circuit analysis tool, based on any one of the first through fifth circuit analysis tools, further comprising a circuit analyzing means for executing a circuit analysis process on the basis of the circuit connection information updated in the element deleting section.

The present invention provides a seventh circuit analysis tool, based on the sixth circuit analysis tool, wherein the circuit connection information stored in the storage section is a net list described at the transistor level, and the circuit analyzing means has a circuit simulation function for executing a circuit simulation on the basis of the net list.

It is acceptable to provide a storage medium storing a program that makes a computer function as the first circuit analysis tool in order to solve the aforementioned problems.

It is also acceptable to provide a storage medium storing a program that makes a computer function as the first circuit analysis tool further provided with a circuit analyzing means for executing a circuit analysis process by means of the circuit connection information updated in the element deleting section.

The first circuit analysis tool of the present invention can reduce the amount of data of the circuit connection information by deleting the circuit element that exerts no influence on the circuit analysis process of the circuit simulation, the logical simulation and the like out of the circuit elements that constitute a circuit specified by the circuit connection information of the semiconductor integrated circuit during the design phase. By using the circuit connection information of the reduced amount of data, the high-accuracy circuit analysis process of SPICE2 or the like can be executed while reducing the time required for the processing from the beginning.

The second circuit analysis tool of the present invention can further prevent the possible deletion of the circuit element that has the terminal connected to the node designated by the operator (designer) in the aforementioned first simulation. This enables the obtainment of a circuit analysis result desired by the operator.

The third circuit analysis tool of the present invention further enables the confirmation of the circuit updated through the deleting process on the basis of the aforementioned first or second circuit analysis tool. This facilitates the circuit design.

The fourth circuit analysis tool of the present invention further enables the confirmation of the result of determination of each node on the basis of the aforementioned third circuit analysis tool. This further facilitates the circuit design.

The fifth circuit analysis tool of the present invention further enables the confirmation of the circuit state before the deletion on the basis of the aforementioned third or fourth circuit analysis tool, and this further facilitates the circuit design.

The sixth circuit analysis tool of the present invention further enables the execution of the circuit analysis process by means of the circuit connection information updated in the element deleting section on the basis of any one of the aforementioned first through fifth circuit analysis tools. By adopting the construction, the analysis process can be executed in a short time from the beginning by means of the circuit connection information of the reduced amount of data.

The seventh circuit analysis tool of the present invention further enables the execution of the circuit simulation in a short time from the beginning by means of the net list of the amount of data reduced in the element deleting section on the basis of the sixth circuit analysis tool.

According to the computer that functions on the basis of the program stored in the storage medium of the present invention, the amount of data of the circuit connection information can be reduced by deleting the circuit element that exerts no influence on the circuit analysis process of the circuit simulation, the logical simulation and the like out of the circuit elements that constitute a circuit specified by the circuit connection information of the semiconductor integrated circuit during the design phase, similarly to the first circuit analysis tool. By using the circuit connection information of the reduced amount of data, the high-accuracy circuit analysis process of SPICE2 or the like can be executed while reducing the time required for the processing from the first time.

Furthermore, by using a storage medium provided with a program of a circuit analysis tool that functions as a circuit analyzing means, the circuit analysis process can be executed by means of the circuit connection information updated in the element deleting section. By adopting the construction, the analysis process can be executed in a short time from the beginning by means of the circuit connection information of the reduced amount of data.

BRIEF DESCRIPTION OF THE DRAWINGS

FIG. 9 is a flowchart of the element deleting process executed by a circuit analysis tool according to a second embodiment.

DETAILED DESCRIPTION OF THE PREFERRED EMBODIMENTS (1) Outline of the Invention

The circuit analysis tool of the present invention distinguishes between a circuit element in which voltage and logical values change in response to the input of a test signal and a circuit element in which no change of the values occurs on the basis of connection information such as a net list of a semiconductor integrated circuit. Depending on this result of determination, the circuit element in which the values are not changed by the input of the test signal, i.e., a circuit element that exerts no influence on the circuit analysis process of a circuit simulation, a logical simulation and the like is replaced by a constant voltage terminal or a grounding terminal. Then, an element deleting process for reducing the number of circuit elements to be subjected to a circuit analysis process to be subsequently executed, and in particular, a circuit analysis process from the first time, i.e., the amount of data of the circuit connection information is executed.

The above-mentioned circuit analysis tool may be provided with the function of not only reducing the amount of data of the circuit connection information but also executing the circuit analysis process of a circuit simulation, a logical simulation or the like on the basis of circuit connection information obtained after the element deleting process.

By adopting the above-mentioned construction, a high-accuracy circuit analysis process can be executed on a large scale integrated circuit in a short time without reducing the accuracy. For example, if the circuit connection information is a net list described at the transistor level, then a result of a high-accuracy circuit analysis can be obtained by a circuit simulator of SPICE2 or the like in a short time by reducing the amount of data of the net list according to the aforementioned method.

A circuit analysis tool according to an embodiment provided with the aforementioned features will be described with reference to the accompanying drawings.

(2) First Embodiment (2-1) Construction of circuit analysis tool

Figure 1:
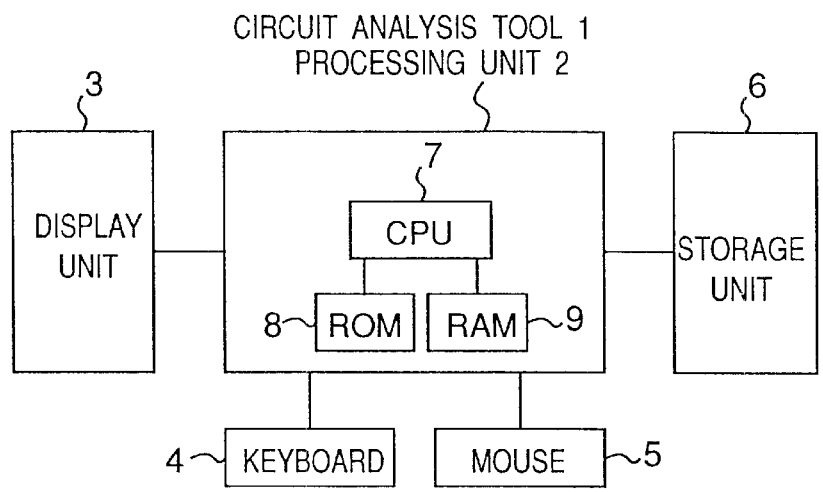
FIG. 1 is a block diagram of a circuit analysis tool according to a first embodiment.

FIG. 1 is a diagram showing a computer system that functions as a circuit analysis tool 1. The circuit analysis tool 1 is constructed of a processing unit 2 for executing an element deleting process of an integrated circuit during the design phase based on circuit connection information, a display unit 3 for displaying a circuit from which a circuit element that exerts no influence on the circuit analysis process of the circuit simulation, logical simulation and the like is deleted through the element deleting process, a keyboard 4 and a mouse 5 that function as a man-to-machine interface for inputting on a selected screen displayed during the setting and processing of parameters for use in the element deleting process and a storage unit 6 constructed of a CD-ROM, a hard disk and the like that store connection information of the integrated circuit during the design phase and a test signal for use in executing the circuit analysis process on the circuit in a state in which they can be read by a CPU 7.

The processing unit 2 is constructed of a central processing unit (referred to as CPU hereinafter) 7, ROM 8 that stores an element deleting process program and a RAM 9 for working use. The CPU7 reads the element deleting process program from the ROM 8 to the RAM 9 and executes the program to update the circuit connection information stored in the storage unit 6 as the occasion demands.

It is acceptable to adopt a construction in which the element deleting process program is stored in a storage medium such as the storage unit 6 that can be accessed by the CPU 7 instead of the ROM 8 and the CPU 7 reads the element deleting process program from the storage medium to the RAM 9 and executes the program.

(2-2) Function block

Figure 2:
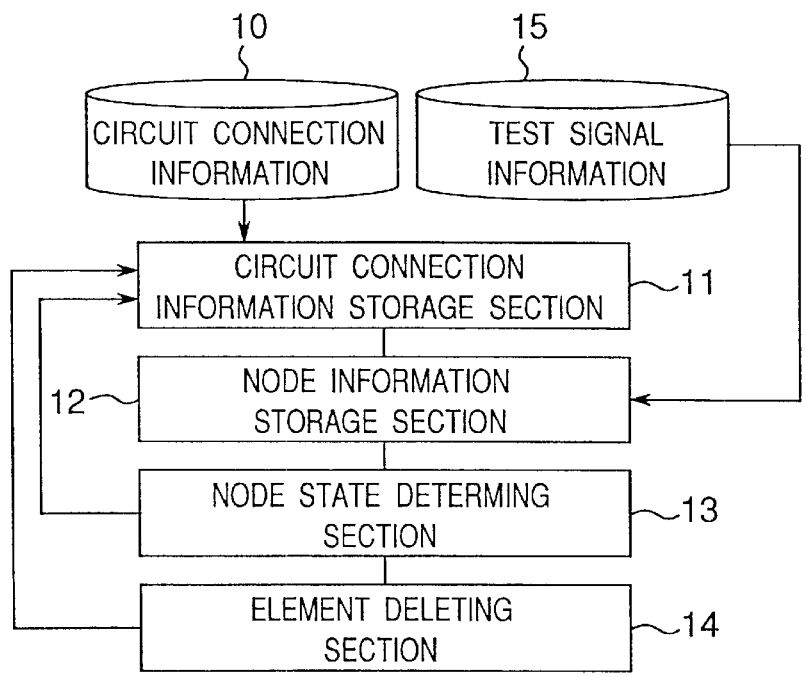
FIG. 2 is a function block diagram of the circuit analysis tool of the first embodiment.

FIG. 2 is a diagram showing the function block of a computer that functions as an element deleting processor. A circuit connection information storage section 11 reads circuit connection information 10 from the storage unit 6 and stores the information. A node state storage section 12 stores the initial value of each node with respect to test signal information 15 set by the designer. The circuit information storage section 11 and the node information storage section 12 correspond to the RAM 9. A node state determining section 13 examines a change in state of each node in accordance with a lapse of time on the basis of the data stored in the node information storage section 12 and determines whether or not the node can be converted into a circuit element of a constant voltage terminal, a grounding terminal or the like according to the state of the circuit element connected to the node. The contents of the above process will be described in detail later. A result of determination in the node state determining section 13 is stored in the circuit connection information storage section 11. An element deleting section 14 deletes a circuit element connected to a node that takes a constant value independently of a lapse of time on the basis of the result of determination in the node state determining section 13 and updates the circuit connection information stored in the circuit connection information storage section 11 so as to provide a constant voltage terminal or a grounding terminal in place of the circuit element.

(2-3) Element deleting process

Figure 3:
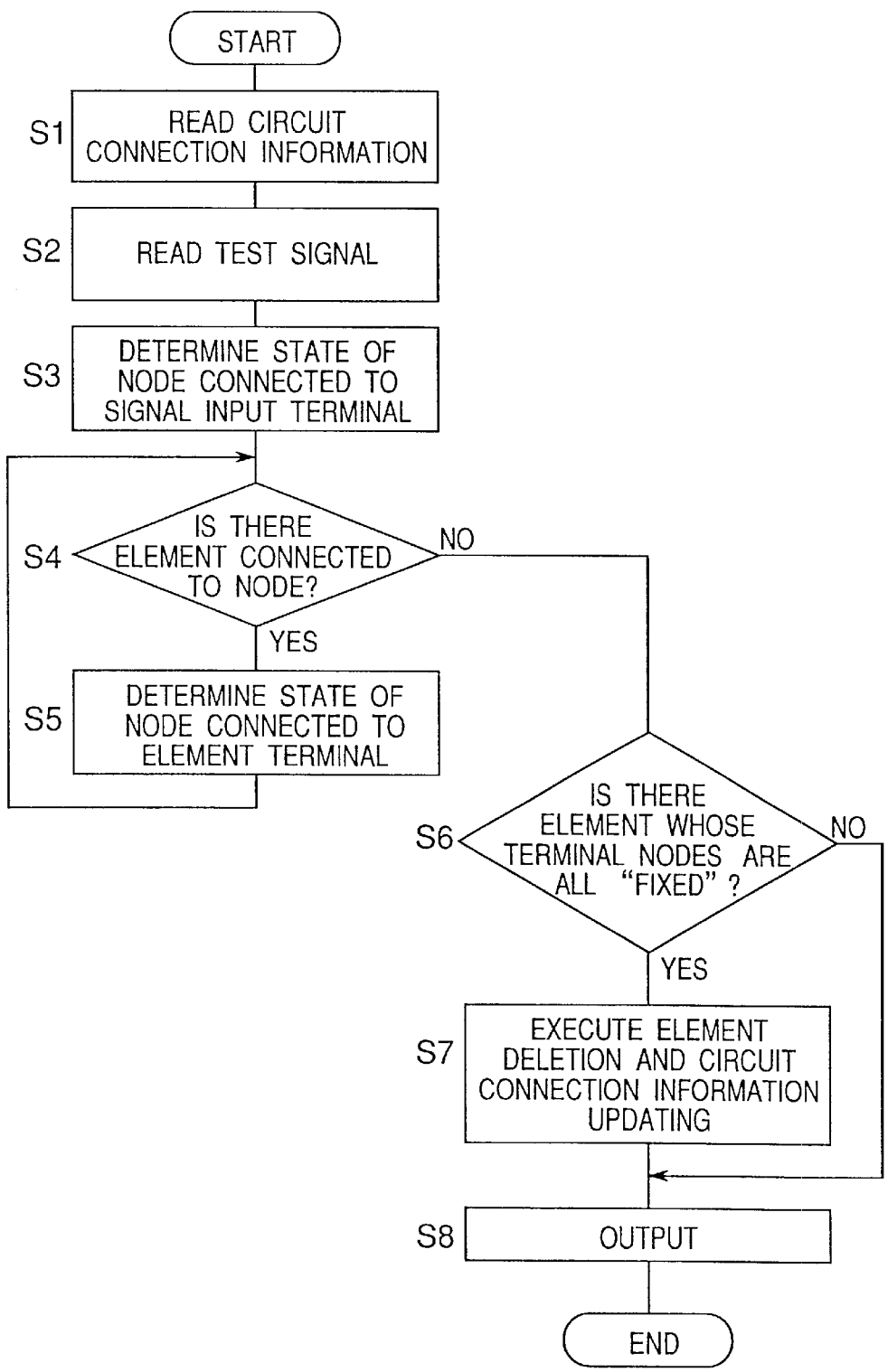
FIG. 3 is a flowchart of an element deleting process executed by the circuit analysis tool of the first embodiment.

FIG. 3 is a flowchart of the element deleting process executed by the CPU 7. First of all, the circuit connection information is read from the storage unit 6, and a circuit specified by the connection information is displayed on the output unit 3 (step S1). Next, a signal for use in executing the circuit analyses of a circuit simulation, a logical simulation or the like for the circuit specified in step S1 is read as a test signal from the storage unit 6 (step S2). If the above-mentioned test signal were inputted to each signal input terminal of the circuit specified by the above-mentioned circuit connection information, the state of the nodes connected to each signal input terminal could change or could not change. Here, the state is determined (step S3). Specifically, it is determined whether or not the node potential or the logical value changes in accordance with a lapse of time. After the determination, information indicating that the output of the node is "fixed" is attached to the circuit connection information with respect to the node of a constant output, and information indicating that the output of the node is "variable" is attached to the circuit connection information with respect to the node whose output changes in accordance with a lapse of time.

If there is a circuit element provided with a terminal connected to the node to be subjected to the determining process (YES in step S4), then the state of the node connected to the other terminals of the circuit element is determined similarly to the aforementioned determining process (step S5). If the node to be subjected to the determining process is connected to none of the terminals of circuit elements (NO in step S4), then it is determined that the determining process of the states of all the nodes inside the circuit is completed, and the program flow proceeds to the next step S6.

If there is a circuit element of which the values of the nodes of the input and output terminals are all in the "fixed" state (YES in step S6), then the circuit element is deleted, and instead the aforementioned circuit connection information is updated so that each node in the "fixed" state is provided with a terminal. Then, information of a number or an expression for specifying the potential or logical value of the node in the "fixed" state in which no change occurs in accordance with a lapse of time is added to each provided terminal (step S7).

The circuit elements that have at least one terminal connected to the node in the "variable" state are excluded from the aforementioned processing (Step S7).

If there is not a circuit element of which the values of the nodes of the input and output terminals are all in the "fixed" state (NO in step S6), then the program flow immediately proceeds to step S8 (skipping Step S7).

Circuit connection information obtained after the completion of the aforementioned processing is stored in the storage unit 6, and the circuit specified by the circuit connection information is displayed on the output unit 3 (step S8) to end the processing. In step S8, the circuit before the circuit element deletion is displayed on the output unit 3 in a state in which the circuit can be discriminated from the circuit obtained after the circuit element deletion by means of, for example, a different color or line type. It is acceptable to display a result of the determining process indicating whether the state of each node is "fixed" or "variable".

As described above, the circuit analysis tool 1 may store the circuit connection information obtained after the element deleting process in the storage unit 6 and end the processing by outputting the information to the output unit 3. The circuit analysis tool 1 may also be provided with the function of executing a circuit analysis process such as a circuit simulation, a timing simulation, a logical simulation or the like by means of the circuit connection information updated through the element deleting process. Specifically, there is a construction in which a simulation program for executing the circuit analysis process such as the aforementioned circuit simulation is stored in the ROM 8 on the basis of the circuit connection information stored in the storage unit 6 besides an element deleting process program and the simulation program is automatically executed after the element deleting process by the circuit analysis tool 1.

The same thing can be said for a circuit analysis tool 50 according to a second embodiment described below.

(2-4) First actual example

Figure 4:
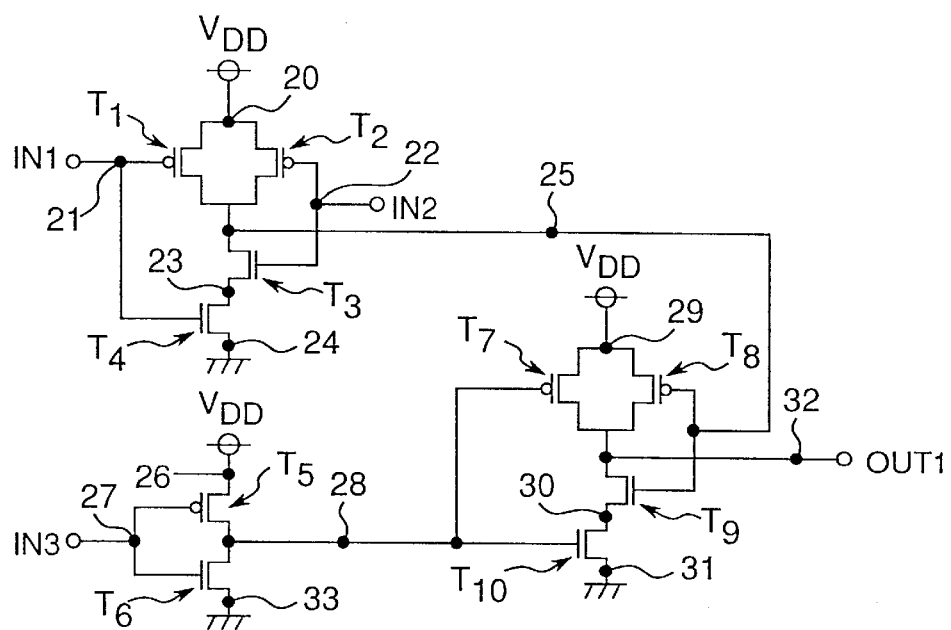
FIG. 4 is a diagram showing an example of a circuit to be subjected to processing.

The element deleting process will be described below with reference to a concrete circuit. FIG. 4 is a diagram showing part of a semiconductor integrated circuit to be subjected to the deleting process. In the circuit, an input terminal of a signal IN1 is connected to the gate electrodes of a p-MOS transistor T1 and an n-MOS transistor T4. The drain electrodes of p-MOS transistors T1 and T2 are connected to a supply terminal of a power voltage $V_{DD}$, and their source electrodes are connected to the drain electrode of an n-MOS transistor T3. The gate electrodes of the p-MOS transistor T2 and the n-MOS transistor T3 are both connected to an input terminal of a signal IN2. The source electrode of the n-MOS transistor T3 is connected to the drain electrode of the n-MOS transistor T4. The source electrode of the n-MOS transistor T4 is grounded.

An input terminal of a signal IN3 is connected to the gate electrodes of a p-MOS transistor T5 and an n-MOS transistor T6. The drain electrode of the p-MOS transistor T5 is connected to the supply terminal of the power voltage $V_{DD}$. The source electrode of the n-MOS transistor T6 is grounded. The source electrode of the p-MOS transistor T5 and the drain electrode of the n-MOS transistor T6 are connected to each other and connected to the gate electrodes of a p-MOS transistor T7 and an n-MOS transistor T10 via a node 28. The drain electrodes of p-MOS transistors T7 and T8 are connected to the supply terminal of the power voltage $V_{DD}$, and their source electrodes are connected to the drain electrode of an n-MOS transistor T9 and an output terminal of a signal OUT1. The source electrode of the n-MOS transistor T10 is grounded. The gate electrodes of the p-MOS transistor T8 and the n-MOS transistor T9 are connected to each other and connected via a node 25 to the drain electrode of the n-MOS transistor T3 and the source electrodes of the p-MOS transistors T1 and T2.

Figure 5:
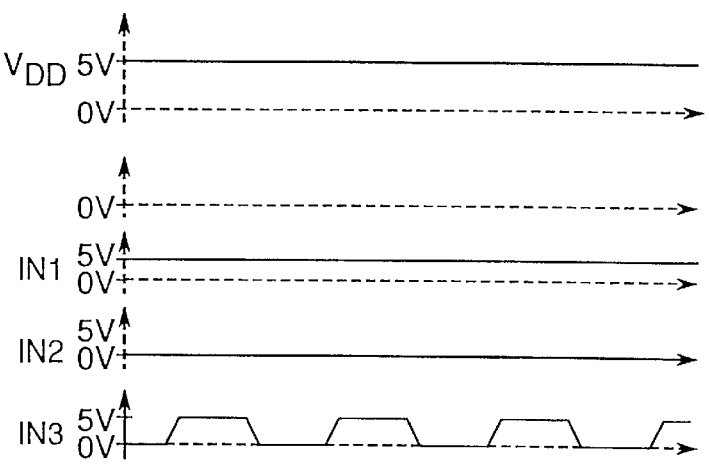
FIG. 5 is a chart showing an example of a test signal.

FIG. 5 is an example of a test signal for use in the above-mentioned circuit. The power voltage $V_{DD}$ is a signal having a constant voltage of 5 V. The signal IN1 is a signal having a constant voltage of 5 V. The signal IN2 is a signal having a constant voltage of 0 V. The signal IN3 is a pulse signal that toggles in the order of 0 V, 5 V, 0V, . . . in accordance with specified timing.

The states of nodes when the aforementioned test signals (refer to FIG. 5) are supplied to the circuit of the aforementioned construction (refer to FIG. 4) are determined. First of all, the states of the nodes connected to the signal input terminals N1 through N3 are determined (corresponding to step S3 of FIG. 3). The values of nodes 20, 26 and 29 supplied with the power voltage $V_{DD}$ are determined to be consistently "fixed" to "5 V". The values of nodes 24, 31 and 33 connected to a ground terminal GND are determined to be consistently "fixed" to "0 V". The state of a node 21 connected to the input terminal of the signal IN1 is determined to be consistently "fixed" to "5 V". The state of a node 22 connected to the input terminal of the signal IN2 is determined to be consistently "fixed" to "0 V". The state of a node 27 connected to the input terminal of the signal IN3 is determined to be "variable" since the state changes in the order of 0 V, 5 V, 0V, . . . according to the value of the signal IN3.

A process for determining the state of nodes connected to the remaining terminals of the circuit element provided with the terminal connected to the node that has been subjected to the determining process is subjected to the determining process (corresponding to steps S4 and S5 of FIG. 3). First of all, the state of the node 23 connected to the terminals of the p-MOS transistor T1 and the n-MOS transistor T4, which are connected to the node 21, is determined. The power voltage of 5 V is applied to the gate electrodes of the transistors T1 and T4. Therefore, the p-MOS transistor T1 is turned off, and the n-MOS transistor T4 is turned on. As a result, this node 23 is determined to be consistently "fixed" to "0 V".

Next, the state of the node 25 connected to the terminals of the p-MOS transistor T2 and the n-MOS transistor T3, which are connected to the node 22, is determined. A voltage of 0 V is applied to the gate electrodes of the transistors. Accordingly, the p-MOS transistor T2 is turned on, and the n-MOS transistor T3 is turned off. As a result, the state of the node 25 is determined to be "fixed" to "5 V" by the output of the p-MOS transistor T2 independently of the output of the n-MOS transistor T3.

Figure 6:
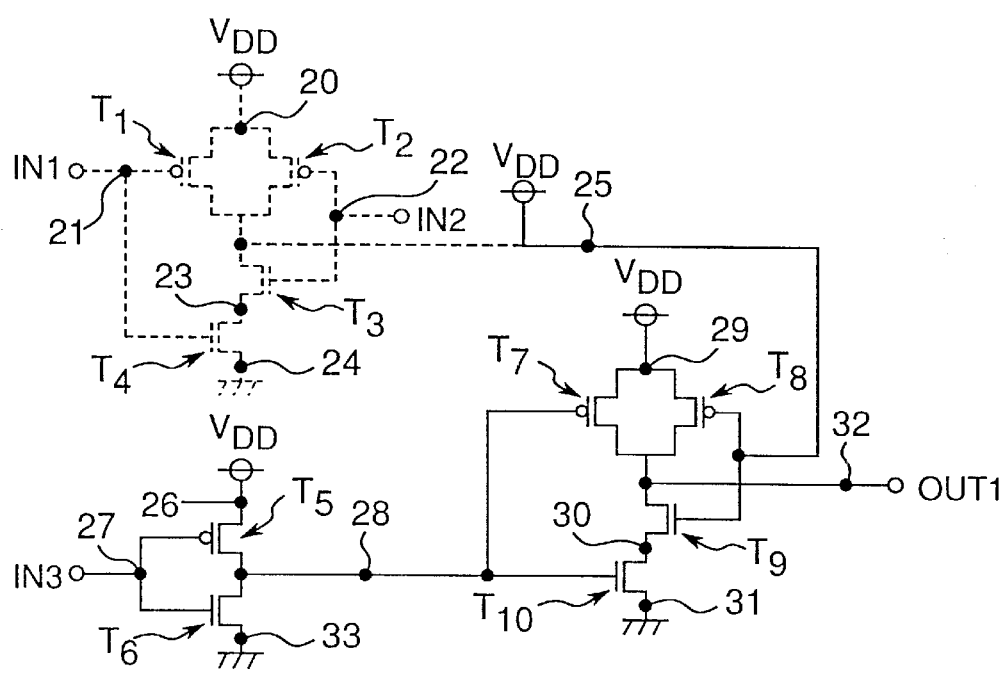
FIG. 6 is a diagram showing a circuit obtained after the execution of an element deleting process.

The states of the other nodes are similarly subjected to the determining process. The node 27 is "variable", and therefore, it can be understood that the nodes (27, 28, 29, 30, 31, 32 and 33) of all the terminals of the transistors are not put in the "fixed" state at the transistors T5, T6, T7, T8, T9 and T10. On the other hand, the nodes of the input and output terminals of the transistors T1, T2, T3 and T4 are determined to be in the "fixed" state. Accordingly, the transistors T1, T2, T3 and T4 are deleted from the circuit, and instead the node 25 is provided with a constant voltage terminal of 5 V, and information indicating that the node 25 is "fixed" to "5 V" is attached to the circuit connection information (corresponding to steps S6 and S7 of FIG. 3). FIG. 6 is a diagram showing an example of an output to the output unit 3 of the circuit specified by the circuit connection information obtained after the aforementioned processing. In this figure, the circuit elements before deletion are indicated by dashed lines.

(2-5) Modification example of element deleting process

Figure 7:
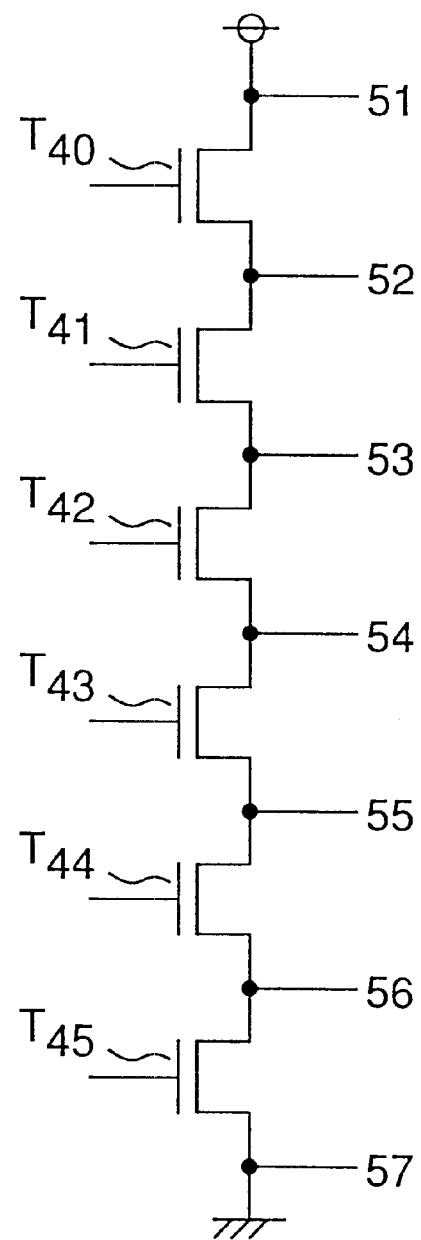
FIG. 7 is a diagram showing an example of a circuit to be subjected to processing.

FIG. 7 is a diagram showing part of a semiconductor integrated circuit to be subjected to the element deleting process. This circuit is obtained by connecting in series six n-MOS transistors T40 through T45, i.e., by connecting the source electrode of the transistor in the preceding stage is connected to the drain electrode of the transistor in the next stage. Although not shown, nodes 52 through 56 are connected to, for example, supply voltage selection circuit terminals. It is also assumed that a voltage of a value greater than that of the threshold voltage is applied to the gate electrodes of the transistors, by which the transistors are in the ON state.

In the circuit having the above-mentioned construction, the potentials of the nodes 51 through 57 are obtained by dividing the power voltage $V_{DD}$ applied to the drain electrode of the transistor T40 by resistances based on the ON-state resistances of the transistors. Therefore, the six n-MOS transistors constituting the circuit, which have their terminal nodes all corresponding to the elements in the "fixed" state, are determined to be subjected to the element deleting process in step S6 to be executed in the element deleting process (FIG. 3).

The potential Vm of the node m (m ranging from 51 through 57) is obtained from the following "Expression 1":

$$V_{DD} \times (1 - \tfrac{1}{6} \times (m\text{-}51)).$$

During the processing of step S7 executed in the aforementioned element deleting process (FIG. 3), the circuit connection information is updated so as to delete the transistors and instead provide constant voltage terminals for the nodes 51 through 57, and information of the "Expression 1"

for specifying the potential of each node and information indicating that the node is in the "fixed" state are further attached to the circuit connection information.

As described above, according to the circuit analysis tool 1 related to the first embodiment, the circuit element whose state is not changed by the input of the test signals in accordance with a lapse of time, i.e., a circuit element that exerts no influence on the circuit analysis process of the circuit simulation, the logical simulation and the like to be subsequently executed is replaced by a constant voltage terminal or a grounding terminal, by which the number of circuit elements to be subjected to the circuit analysis process, i.e., the amount of data of the circuit connection information can be reduced.

With this arrangement, the circuit analysis process using a high-accuracy circuit simulator of SPICE2 or the like can be executed in a short time even during the design phase of a large scale integrated circuit.

(3) Second Embodiment

According to the circuit analysis tool 1 of the aforementioned first embodiment, each circuit element whose state is not changed by the input of the test signals is converted into the constant voltage terminal or the grounding terminal. However, depending on cases, it is sometimes the case where a circuit element provided with a terminal connected to the node to which the designer pays attention might be inadvertently deleted. Therefore, in a circuit analysis tool 50 according to the second embodiment, each circuit element connected to the node designated by the designer is excluded from those subjected to the deleting process after certain confirmation.

The construction of the circuit analysis tool 50 of the second embodiment is the same as that of the circuit analysis tool 1 of the first embodiment, and therefore, no description is provided therefor herein. Furthermore, when indicating the constituent elements of the circuit analysis tool 50 in the following description, the constituent elements are denoted by the same reference numerals as those used in the circuit analysis tool 1.

The element deleting process executed by the circuit analysis tool 50 of the second embodiment will be described below by means of a simple circuit.

Figure 8:
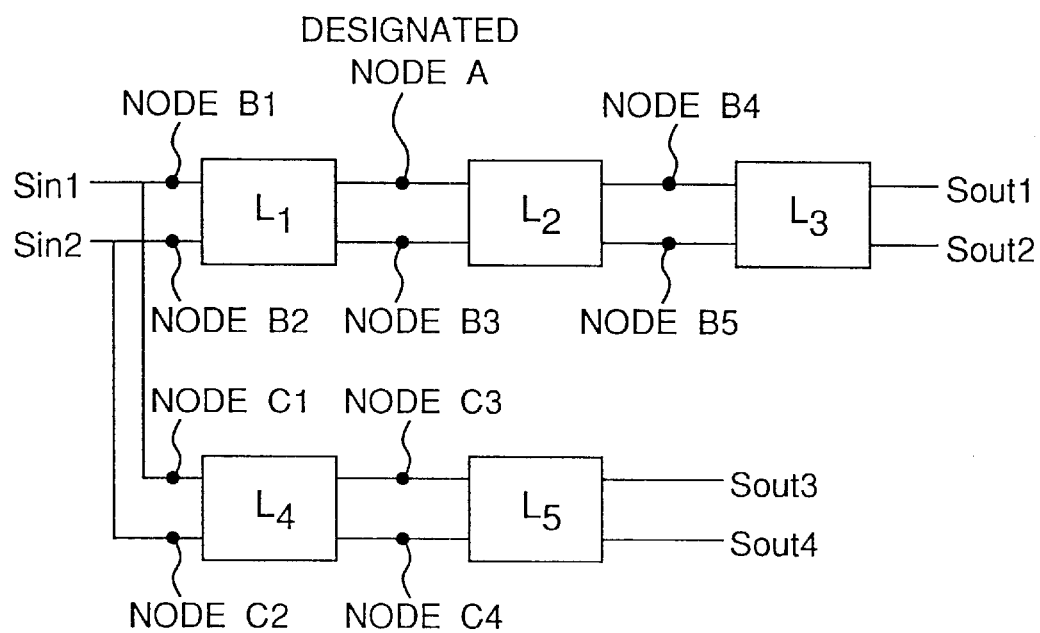
FIG. 8 is a diagram showing an example of a circuit to be subjected to processing.

FIG. 8 is a diagram showing part of the semiconductor integrated circuit to be subjected to the processing of the circuit analysis tool 50 of the second embodiment. It is to be noted that the circuit elements are expressed as $L_1$ through $L_5$ for the sake of convenience. There are provided a series connection of the circuit elements $L_1$, $L_2$ and $L_3$ and a series connection of the circuit elements $L_4$ and $L_5$. Test signals Sin1 and Sin2 are inputted to each of the circuit elements $L_1$ and $L_4$. In contrast to this, signals Sout1 and Sout2 are outputted from the circuit element $L_3$, while signals Sout3 and Sout4 are outputted from the circuit element $L_5$.

The following provides consideration for, for example, the case where the input signal Sin1 has a constant voltage of 5 V, the input signal Sin2 has a constant voltage of 0 V, the potentials nodes A and B1 through B5 connected to the terminals of the circuit elements $L_1$ and $L_2$ and the potentials of nodes C1 through C4 connected to the terminals of the circuit element L4 are constant and the designer designates the node A as the attentional node.

In the circuit analysis tool 50 of the second embodiment, after confirmation executed by the operator, the results of determination concerning all the nodes A and B1 through B5 connected to the terminals of the circuit elements $L_1$ and $L_2$ that have the terminals connected to the node A designated by the designer are changed from "fixed" to "variable". As a result, the circuit elements $L_1$, $L_2$ and $L_3$ are not deleted, and only the circuit element L4 is deleted through the element deleting process to be subsequently executed. As described above, the circuit analysis tool 50 of the second embodiment can prevent the inadvertent deletion of the node to which the designer pays attention.

FIG. 9 is a flowchart of the element deleting process to be executed by the circuit analysis tool 50 of the second embodiment. First of all, circuit connection information is read from the storage unit 6, and the circuit specified by the connection information is displayed on the output unit 3 (step S20). Next, the data of the signals used for the circuit analysis of a circuit simulation, a logical simulation and the like of the aforementioned specified circuit are read from the storage unit 6 (step S21). The attentional node is designated (step S22). The designating process is executed by, for example, the operator who operates the keyboard 4 and the mouse 5 referring to the circuit displayed on the output unit 3 in the aforementioned step S20.

If the aforementioned test signals were inputted to each signal input terminal of the circuit specified by the aforementioned circuit connection information, the state of the nodes connected to each signal input terminal could change or could not change. Here, the state is determined (step S23). Specifically, it is determined whether or not the voltage value and the logical value of each node change in accordance with a lapse of time with respect to the input of the test signals. After the determination, information indicating that the output of the node is "fixed" is attached to the circuit connection information for the node whose output is constant, and information indicating that the output of the node is "variable" is attached to the circuit connection information for the node whose output changes in accordance with a lapse of time.

If there is a circuit element provided with a terminal connected to the node to be subjected to the determining process (YES in step S24), then the state of each node connected to the remaining terminals of the circuit element is determined similarly to the aforementioned determining process (step S25). If there is no circuit element provided with a terminal connected to the node to be subjected to the determining process (NO in step S24), then it is determined that the determination of the states of all the nodes inside the circuit has been completed, and the program flow proceeds to the next step S26. If there is a designated node whose state is "fixed" (YES in step S26), then a selection screen for confirming whether or not the designated node is to be left is displayed on the output unit 3 (step S27). If the operator (circuit designer) makes a selection to leave the designated node by operating the keyboard 4 or the mouse 5 (YES in step S28), then the contents of the information indicating the states of all the nodes connected to the terminals of the circuit element having the terminal connected to the designated node are changed to "variable" (step S29). If the operator makes a selection to delete the designated node on the screen displayed in the aforementioned step S27 (NO in step S28), then the program flow proceeds to the next step S30 without changing the circuit connection information of the designated node.

If there is a circuit element of which the state of all nodes connected to the input and output terminals is "fixed" (YES in step S30), then the circuit element is deleted, and the aforementioned circuit connection information is updated so that each node in the aforementioned "fixed" state is provided with a terminal instead, and information of a number or an expression for specifying the potential or logical value of the node in the "fixed" state in which no change occurs in accordance with a lapse of time is added to each provided terminal (step S31). The circuit elements of which at least one of the states of the nodes connected to the input and output terminals is "variable" are excluded from aforementioned processing (step S31). If there is not a circuit element of which the state of all nodes connected to the input and output terminals is "fixed" (NO in step S30), then the program flow immediately proceeds to step S32.

A circuit specified by the circuit connection information obtained after the completion of the aforementioned processing is displayed on the output unit 3 (step S32), and the processing is completed. The output to the output unit 3 is displayed so that the circuit before the circuit element deletion can be discriminated from the circuit obtained after the circuit element deletion by means of, for example, a different color or line type. It is acceptable to display the result of the determining process indicating whether the state of each node is in the "fixed" or "variable" state, similarly to the circuit analysis tool 1 of the first embodiment.

As described hereinabove, according to the circuit analysis tool 50 of the second embodiment, the amount of data of the circuit connection information can be reduced to allow the time required for the circuit analysis process to be reduced by replacing the circuit element connected to only the node that is not changed by the input of the test signal and is other than the attentional designated node, i.e., the circuit element that exerts no influence on the circuit analysis process of the circuit simulation, the logical simulation and the like with a constant voltage terminal or a grounding terminal through the selection executed by the designer and updating the circuit connection information in correspondence with this. With this arrangement, the circuit analysis process can be executed in a short time by means of a high-accuracy circuit simulator of SPICE2 or the like even for a large scale semiconductor integrated circuit.

What is claimed is:

1. A circuit analysis tool comprising:
   a storage section of circuit connection information of a semiconductor integrated circuit;
   a node state determining section that, when a specified signal is inputted to signal input terminals or internal nodes of the circuit specified by a circuit connection information stored in the storage section, determines at every node connected to terminals of circuit elements constituting the circuit whether or not potential of the node changes in accordance with a lapse of time;
   a designating means for designating an attentional node among the nodes inside the circuit specified by the circuit connection information stored in the storage unit; and
   a designated node protecting means for changing determination results of all nodes, connected to the terminals of the circuit element(s) connected to the designated node, each to correspond to a node whose potential changes in accordance with a lapse of time, when a circuit element connected to the attentional node exists among the circuit elements that have only terminals connected to the node(s) whose potential, is/are determined to be unchanged in accordance with a lapse of time in the node state determining section; and
   an element deleting section that updates the circuit connection information so as to delete a circuit element provided with only a terminal connected to a node whose potential does not change in accordance with a lapse of time from the circuit specified by the circuit connection information stored in the storage section on the basis of a result of determination in the node state determining section and of the changed result of determination in the designated node protecting means and instead provide each node whose potential does not change with a terminal, and attaches information for specifying the potential of the node that does not change in accordance with a lapse of time to each terminal provided.

2. A circuit analysis tool as claimed in claim 1, further comprising:
   an output unit for displaying the circuit specified by the circuit connection information updated by the element deleting section.

3. A circuit analysis tool as claimed in claim 2, wherein the output unit displays the result of determination in the node state determining section with regard to each node of the circuit to be displayed.

4. A circuit analysis tool as claimed in claim 2, wherein the output unit further displays the circuit specified by the circuit connection information obtained before the updating executed by the element deleting section in a state in which the circuit can be discriminated from the circuit specified by the circuit connection information obtained after updating.

5. A circuit analysis tool as claimed in claim 3, wherein the output unit further displays the circuit specified by the circuit connection information obtained before the updating executed by the element deleting section in a state in which the circuit can be discriminated from the circuit specified by the circuit connection information obtained after updating.

6. A circuit analysis tool as claimed in claims 1, further comprising:
   a circuit analyzing means for executing a circuit analysis process on the basis of the circuit connection information updated in the element deleting section.

7. A circuit analysis tool as claimed in claim 6, wherein the circuit connection information stored in the storage section is a net list described at transistor level, and the circuit analyzing means has a circuit simulation function for executing a circuit simulation on the basis of the net list.

8. A computer-readable storage medium storing a program that makes a computer function as a circuit analysis tool comprising:
   a node state determining section that determines every node whether or not potentials of nodes connected to terminals of circuit elements constituting a circuit change in accordance with a lapse of time when a specified signal is inputted to signal input terminals of the circuit specified by the circuit connection information stored in the storage section;
   a designating means for designating an attentional node among the nodes inside the circuit specified by the circuit connection information stored in the storage unit; and
   a designated node protecting means for changing determination results of all nodes, connected to the terminals of the circuit element(s) connected to the designated node, each to correspond to a node whose potential changes in accordance with a lapse of time, when a circuit element connected to the attentional node exists among the circuit elements that have only terminals connected to the node(s) whose potential(s) is/are determined to be unchanged in accordance with a lapse of time in the node state determining section; and an element deleting section that updates the circuit connection information so as to delete a circuit element provided with only a terminal connected to a node whose potential does not change in accordance with a lapse of time from the circuit specified by the circuit connection information stored in the storage section on the basis of a result of determination in the node state determining section and of the changed result of determination in the designated node protecting means and instead provide each node whose potential does not change with a terminal, and attaches information for specifying the potential of the node that does not change in accordance with a lapse of time to each terminal provided.

9. A computer-readable storage medium as claimed in claim 8, which stores a program that makes the computer further function as a circuit analysis tool provided with a circuit analyzing means for executing a circuit analysis process on the basis of the circuit connection information updated in the element deleting section.

* * * * *